United States Patent [19]

Komatsubara

[11] Patent Number: 4,967,871

[45] Date of Patent: Nov. 6, 1990

[54] BODY-SENSIBLE ACOUSTIC DEVICE

[75] Inventor: Masahiko Komatsubara, Yamagata, Japan

[73] Assignee: Pioneer Electronic Corporation, Tokyo, Japan

[21] Appl. No.: 109,012

[22] Filed: Oct. 16, 1987

[30] Foreign Application Priority Data

Oct. 16, 1986 [JP] Japan ................................ 61-244091
Apr. 3, 1987 [JP] Japan ..............................62-50730[U]

[51] Int. Cl.[5] ................................................ H05K 5/00

[52] U.S. Cl. .................................... 181/141; 181/144; 181/161; 181/172; 381/162; 381/182; 381/188; 381/192; 381/197; 381/205; 128/33

[58] Field of Search ............... 181/141, 161, 171, 172, 181/164–166, 144, 150, 199; 381/86, 87, 90, 187, 188, 192–197, 203, 162, 159, 182; 128/33; 297/441

[56] References Cited

U.S. PATENT DOCUMENTS

| | | | |
|---|---|---|---|
| 2,520,172 | 8/1950 | Rubinstein . | |
| 3,075,101 | 1/1963 | Neff . | |
| 3,556,088 | 1/1971 | Leonardini | 128/33 |
| 3,727,607 | 4/1973 | Dill | 128/33 |
| 3,880,152 | 4/1975 | Nohmura | 128/33 |
| 4,023,566 | 5/1977 | Martinmaas | 128/33 |
| 4,055,170 | 10/1977 | Nohmura | 128/33 |
| 4,062,589 | 12/1977 | Klein et al. | 297/441 X |
| 4,064,376 | 12/1977 | Yamada | 381/182 X |
| 4,327,257 | 4/1982 | Schwartz | 381/197 |
| 4,550,428 | 10/1985 | Yanagishima et al. | 381/86 |

FOREIGN PATENT DOCUMENTS

| | | |
|---|---|---|
| 7317751 | 10/1973 | Fed. Rep. of Germany . |
| 2356481 | 2/1975 | Fed. Rep. of Germany . |
| 2745002 | 7/1978 | Fed. Rep. of Germany . |
| 2155472 | 7/1980 | Fed. Rep. of Germany . |
| 2919884 | 4/1982 | Fed. Rep. of Germany . |
| 3512087 | 1/1986 | Fed. Rep. of Germany . |
| 3522305 | 1/1986 | Fed. Rep. of Germany . |
| 3537210 | 4/1986 | Fed. Rep. of Germany . |

*Primary Examiner*—Benjamin R. Fuller
*Attorney, Agent, or Firm*—Sughrue, Mion, Zinn, Macpeak & Seas

[57] ABSTRACT

A body-sensible acoustic device and an electromechanical vibration converter for use in the same. The body-sensible acoustic device includes frames forming the structure of a chair having a seat and a back, canvas members spread on the frame, and driver units driven by low-frequency audio signals for transmitting vibration to the canvas members. The canvas members are formed of a net of fibers covered with a foamed synthetic resin. The vibration converter includes a drive coil disposed in the air gap of a magnetic circuit, a coil bobbin transmitting motion of the drive coil to the outer case of the converter, and a damper supporting the magnetic circuit on the outer case. A guide hole is formed in the magnetic circuit at its center and extending in the direction of the acoustic axis. A coupling member is fitted in the guide hole having end portions coupled to the outer case.

16 Claims, 4 Drawing Sheets

BODY-SENSIBLE ACOUSTIC DEVICE

BACKGROUND OF THE INVENTION

A body sensible acoustic device is designed so that it transmits vibration from a driver unit to the body of the listener, i.e., to allow the person to feel sound through his or her body. In general, such a device is built into a chair or sofa so that it has a maximum contact area with the body. In the case when the device is built into a chair, both the device and the chair must perform their own functions satisfactorily.

An example of a conventional body sensible acoustic device built into a chair is shown in FIG. 1. In FIG. 1, reference numeral 1 designates the frames of the chair, which has a seat 1*a* and a back 1*b*; 2, driver units provided with sub-frames in the seat 1*a* and the back 1*b*, the driver units 2 being driven by low-frequency electrical input signals; and 3, canvas members spread on the frames 1 of the seat 1*a* and the back 1*b*, the canvas members 3 being made of a canvas material such as that used, for instance, for tents.

In this conventional body sensible acoustic body, low-frequency electrical signals are applied to the driver units 2 supported by the canvas members 3 so that vibration is transmitted to the human body. Cushions or the like can be placed on the, seat, 1*a* and the back 1*b* if necessary. In such a case, however, the vibration must be transmitted to the body through both the canvas member 3 and the cushions.

The conventional body sensible acoustic device thus constructed suffers from a drawback in that, when the driver units 2 vibrate, leakage sound is produced, heard as distorted sound, in the canvas members 3.

Regarding the canvas member 3 as a mechanically vibrating element, it is small in weight, large in stiffness, and small in resistance (or internal loss). Because of these characteristics, the lowest resonance frequency of the material is high, and therefore the vibration sensed by the human body is not sufficient in the low-frequency range.

The invention further relates to an electromechanical vibration converter which may be used as the driver in such a body-sensible acoustic device, and more particularly to an electromechanical vibration converter having increased ranges of the lowest resonance frequency and reduced resonance sharpness.

Examples of a conventional electromechanical vibration converter are a loudspeaker unit and a transducer in a body-sensible acoustic device. Typical examples are shown in FIGS. 2 and 3. In the converter, a magnetic circuit 42 is provided in an outer case 41, and an annular damper 43 (FIG. 3) is constructed in such a manner that its inner peripheral portion is held between a top plate 42A and a magnet 42B and its outer peripheral portion is secured to the outer case 41. A cap 41A is engaged with the outer case 41 in such a manner that the outer peripheral portion of the damper 43 is pushed against the outer case 41 by the cap 41A.

One end of coil bobbin 44 is fixedly secured to the cap 41A. A drive coil 44A wound on the coil bobbin 44 is positioned in the air gap of the magnetic circuit 42.

When a drive current is supplied to the drive coil 44A, a drive force is produced in the coil bobbin 44 by the magnetic flux formed in the air gap, thus moving the coil bobbin 44. In this operation, the magnetic circuit 42, being elastically suspended by the damper 43, is moved relative to the outer case 41. Therefore, if the outer case 41 is secured to an element to be vibrated which has an appropriate mechanical impedance, then the converter can vibrate according to the output signal of the element.

As is apparent from the above description, the damper 43 is generally made of a thin plate, and therefore it cannot provide a sufficiently high internal loss. Accordingly, the converter has an extremely high resonance sharpness, and consequently a narrow effective frequency band for reproduction. That is, the converter has a poor transient response.

Furthermore, in this converter, the tension of the damper 43 is utilized to suppress the excessively large amplitude due to the high resonance sharpness. As a result, when the input is high, the damper responds to it as indicated by the waveform shown in FIG. 4, that is, with the peaks collapsed. Therefore, if the converter is used for a long period of time, the damper has a tendency to break.

The center of gravity of the magnetic circuit 42 does not coincide with the position of support of the damper 43. Not only because of this fact, but also because of the size of the magnetic circuit, a rolling phenomenon is liable to occur, thus causing irregular vibration or residual vibration.

SUMMARY OF THE INVENTION

An object of this invention is thus to eliminate the above-described difficulties accompanying a conventional body-sensible acoustic device. More specifically, an object of the invention is to provide a body-sensible acoustic device which produces less leakage sound due to the vibration of the canvas member and which excels in the production of low-frequency vibrations.

In the body sensible acoustic device of the invention, canvas members spread on frames forming the structure of a chair are formed by covering a net of fibers with foam synthetic resin.

A further object of the invention is to eliminate the above-described difficulties accompanying a conventional electromagnetic vibration converter.

This object of the invention has been achieved by the provision of an electromechanical vibration converter which, according to the invention, comprises a magnetic circuit having a guide hole formed at its center extending in the direction of the acoustic axis, and a coupling member fitted in the guide hole and having end portions coupled to the outer case, whereby a drive force generated by the drive coil is transmitted only in the direction of the acoustic axis.

DESCRIPTION OF THE PREFERRED EMBODIMENTS

Preferred embodiments of the invention will be described with reference to the accompanying drawings.

Figure 1:
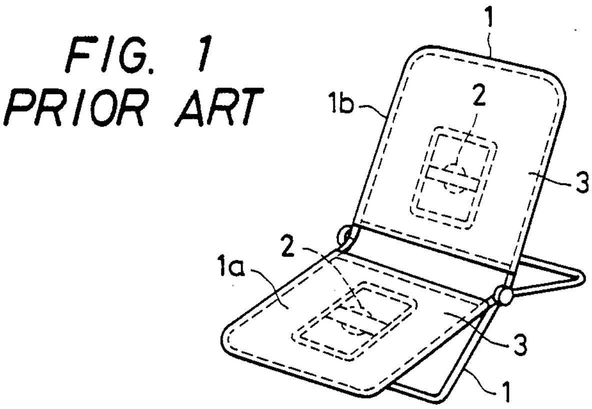
FIG. 1 PRIOR ART
FIG. 1 is a perspective view of a conventional body-sensible acoustic device.
Figure 2:
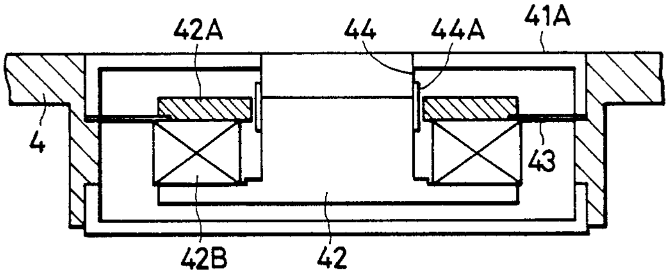
FIG. 2 PRIOR ART
FIG. 2 is a sectional view of a conventional electromechanical vibration converter.
Figure 3:
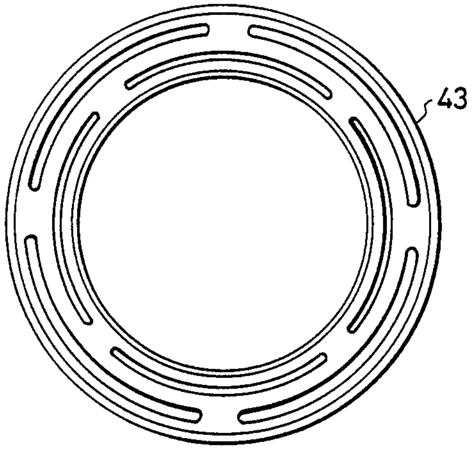
FIG. 3 PRIOR ART
FIG. 3 is a plan view of a damper in the conventional electromechanical vibration converter.
Figure 4:
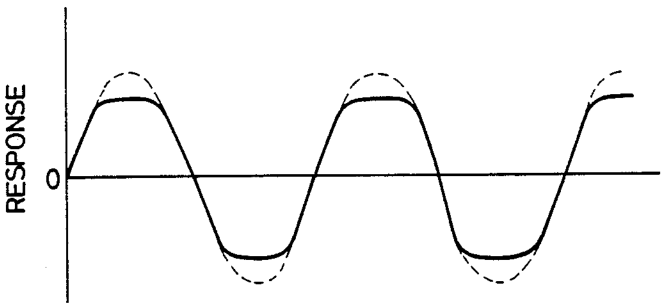
FIG. 4 is a characteristic diagram for a description of the operation of the damper.
Figure 5:
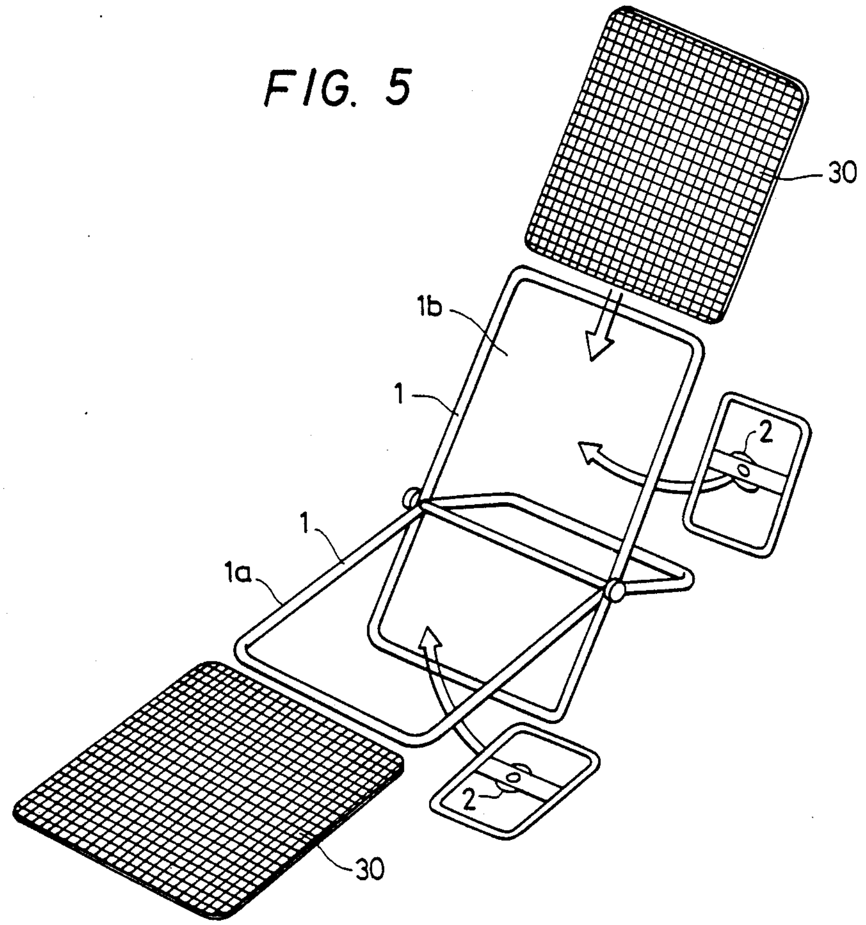
FIG. 5 is an exploded perspective view showing an example of a body-sensible acoustic device constructed according to the invention.

FIG. 5 is a perspective view showing an example of a body-sensible acoustic device constructed according to the invention. In FIG. 5, those components which have been previously described with reference to FIG. 1 showing the conventional body-sensible acoustic device are therefore designated by the same reference numbers or characters.

In FIG. 5, reference numeral 30 designates canvas members spread on the frames 1. Each of the canvas members 30 is composed of a net of fibers, and a foamed synthetic resin layer which covers the net.

The warps and wefts of the nets are formed by twisting several tens of, for instance, polyester filaments, and the warps and the wefts are arranged at intervals of about 5 mm (the mesh being 5 $mm^2$). The nets of fibers are coated with a foaming resin, for instance, vinyl chloride resin, and are then subjected to low foaming.

The canvas members 30 thus formed are folded in two to form bags. The driver units 2 are inserted into the bags thus formed, and the bags are spread and hung on the frames 1 of the seat 1*a* and the back 1*b*.

Figure 6:
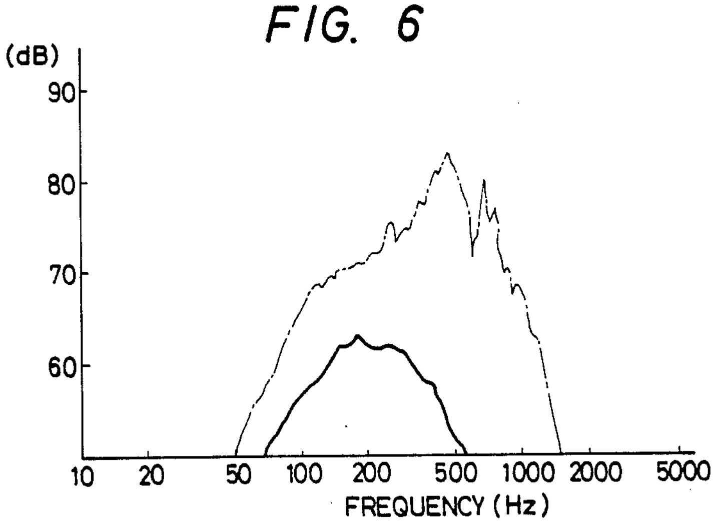
FIG. 6 is a characteristic diagram showing the sound leakage of canvas members.

FIG. 6 is a graphic representation comparison of the body-sensible acoustic device of the invention with the conventional one.

More specifically, FIG. 6 shows the characteristic curves of leakage sound of the device of the invention and of the conventional device. As is apparent from FIG. 6, with the conventional body-sensible acoustic device, the sound pressure level is relatively high over the entire frequency range, whereas with the body-sensible acoustic device of the invention, only low sound pressure levels are detected in a range of from 100 Hz to 500 Hz.

The body-sensible acoustic device of the invention, which employs canvas members formed by covering a net of fibers with foam synthetic resin, has the following advantages and merits:

(1) When the canvas member is vibrated by the driver unit 2, the vibration is not a complete planar vibration, and therefore production of leakage sound is prevented.

(2) Since the canvas member is formed by covering the net with the foam resin, the canvas member is increased in weight, resulting in a reduced lowest resonance frequency.

(3) As the fibers forming the canvas member are covered with the foam resin, the canvas member has an increased flexibility, i.e., reduced stiffness, and increased internal loss. As a result, the lowest resonance frequency of the canvas member is lowered and the resonance sharpness (Q factor) reduced. Owing to the decrease of resonance sharpness, the body sensible vibration is received as being more natural and less abrupt.

Figure 7:
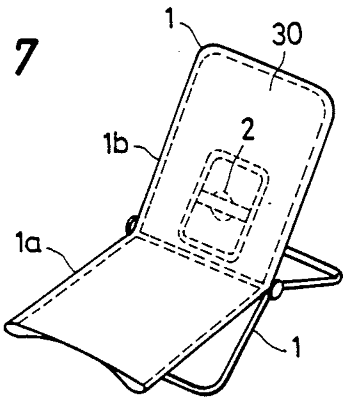
FIG. 7 is a perspective view showing another example of a body sensible acoustic device according to the invention.

FIG. 7 is a perspective view showing another example of a body-sensible acoustic device constructed according to the invention. In this device, the seat 1*a* and the back 1*b* of the chair are covered with a canvas member 30, and the driver unit 2 is provided in the canvas member at the back 1*b*. In this device, the vibration becomes directional, and the vibration of the seat 1*a* is smaller in level than that of the back 1*b*. This prevents the listener from feeling uncomfortable.

As described above, in the body-sensible acoustic device according to the invention, a canvas member vibrated by a driver unit is formed by covering a net of fibers with a foam synthetic resin. With this construction, the device of the invention prevents the production of leakage sound due to the vibration of the canvas member, and provides excellent reproduction of sound in a low frequency range.

Figure 8:
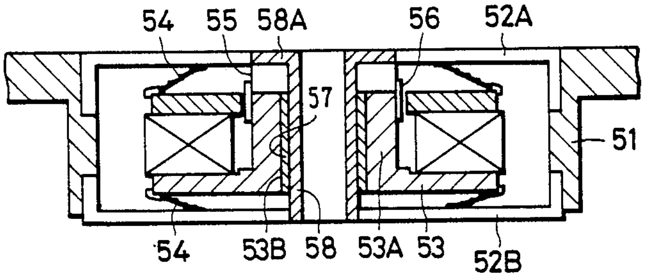
FIG. 8 is a sectional view showing an example of an electromechanical vibration converter and FIG. 9 is a sectional view showing another example of an electromechanical vibration converter.

Another embodiment of this invention will be described with reference to FIG. 8. In FIG. 8, reference numeral 51 designates a cylindrical outer case having a small height. Caps 52A and 52B are fitted in both end surfaces of the outer case 51, thus forming a gap therein. In this gap, a magnetic circuit 53 is suspended with rubber dampers 54 which are each formed internally with a conical coil constructed by molding. The other edges of the dampers 54 are secured to the caps 52A and 52B.

One end portion of a coil bobbin 55 together with the flange 58A of a cylindrical member 58 (described below) is fixedly secured to cap 52A. A drive coil 56 is wound on the coil bobbin 55. The drive coil 56 is positioned in the air gap of the magnetic circuit 53.

The magnetic circuit 53 has a center pole 53A in which a guide hole 53B is formed along the central axis. A self-lubricating slide guide member 57 made of metal or acetal resin is fitted in the guide hole 53B thus formed.

A coupling member, namely, the aforementioned cylindrical member 58 having the flange 58A at one end, is inserted in the slide guide member 57 with a gap of the order of 0.01 mm to 0.06 mm in such a manner that, even during piston motion, the drive coil 56 cannot contact the top plate. The flange 58A is secured to the cap 52A. The other end portion of the cylindrical member 58 is secured to the other cap 52B. The cylindrical member 58 is in the form of a pipe through which the two sides of the converter are communicated.

When a drive current is supplied to the drive coil 56, the coil bobbin 55 moves in a reciprocal motion in response to the magnetic flux in the air gap; that is, the caps 52A and 52B are vibrated. The vibration of the caps 52A and 52B is transmitted through the coil bobbin 55 to the cylindrical member 58, as a result of which the latter moves along the slide guide member 57.

In this operation, the dampers 54 function to regulate the position of the magnetic circuit in the static state (its zero point during vibration), to provide stiffness (an elastic component) between the outer case 51 and the magnetic circuit 53, and to provide resistance.

In operation, Joule heat is generated in the drive coil, and friction heat is generated between the cylindrical member 58 and the slide guide member 57. However, this heat causes no problem if the operating frequency is lower than about 200 Hz. Even when the operating frequency is higher than about 100 Hz, the lubricating ability of the slide guide member 57 suppresses the generation of heat and the production of sliding noise.

In the above described embodiment, the coupling member between the caps is a hollow cylindrical member. However, instead of a hollow cylindrical member, a solid cylindrical member may be employed if it can sufficiently radiate heat. Furthermore, the dampers 54 are not limited in configuration so long as they provide appropriate elasticity and resistance. The slide guide member 57 may be a shorter one which is fitted in only one end portion of the guide hole 53B.

Figure 9:
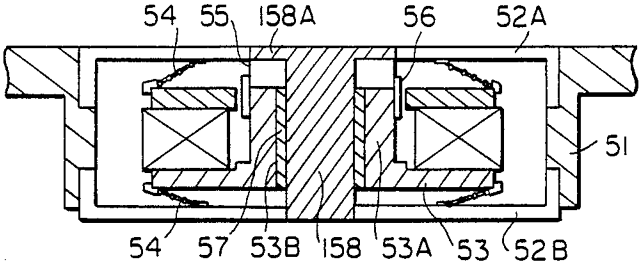

An electromechanical vibration converter having a solid cylindrical member as described above is illustrated in FIG. 9. Elements having the same reference numerals as those shown in FIG. 8 are the same and a description thereof is omitted at this point. Cylindrical member 158 is a solid cylindrical member which has a flange 158A at one end and which functions similarly to hollow cylindrical member 58 shown in FIG. 8.

As is apparent from the above description, in the electromechanical vibration converter of the invention, a guide hole is formed along the central axis of the magnetic circuit, the coupling member is slidably fitted in the guide hole, and both ends of the coupling member are secured to the outer case. As a result, the converter of the invention has the following advantages and merits:

(a) It is unnecessary for the dampers to hold the magnetic circuit at the center in the axial direction. Therefore, the configuration and structure of the dampers can be freely determined for adjustment of stiffness and resistance. Accordingly, the lowest resonance frequency and the resonance sharpness can be adjusted for wider ranges, and hence the performance of the converter can be greatly improved.

(b) The converter of the invention is free from the difficulty of the excessively large amplitude being nonlinearly suppressed. Therefore, in the converter of the invention, the power linearity is improved and breakage of the dampers prevented.

(c) Since the magnetic circuit is supported at least two points in the direction of vibration, the rolling phenomenon is eliminated, and accordingly irregular vibration and residual vibration are also eliminated.

(d) Since the degree of freedom in selecting the configuration of the dampers is increased, the outer case can be miniaturized if desired.

What is claimed is:

1. A body-sensible acoustic device, comprising:

frames forming a chair structure;

canvas members spread on said frames to form a seat and a back of said chair structure, said canvas members supporting a listener and being formed by covering a net of fibers with a foam synthetic resins; and one or more driver units disposed near and supported by said canvas members for receiving low frequency signals to vibrate said canvas members.

2. The body-sensible acoustic device of claim 1, wherein the warps and wefts of said net of fibers are arranged at intervals of approximately 5 mm.

3. The body-sensible acoustic device of claim 1, wherein said resin is a vinyl chloride resin.

4. The body-sensible acoustic device of claim 1, wherein said canvas members are folded in two to form respective bags, a driver unit being inserted in each said bag.

5. The body-sensible acoustic device of claim 1, wherein one of said driver units is disposed on a surface of one of said canvas members which forms the back of said chair structure.

6. The body-sensible acoustic device of claim 1, wherein canvas members support the weight of a person sitting on said chair.

7. A body-sensible acoustic device, comprising:

frames forming a chair structure having a seat and a back;

canvas members spread on said frames, said canvas members being formed by covering a net of fibers with a foam synthetic resin; and one or more driver units disposed near said canvas members for receiving low frequency signals to vibrate said canvas members, at least one of said driver units including an electromechanical vibration converter comprising:

an outer case having one or more end caps;

a magnetic circuit having an air gap;

a drive coil disposed in said air gap of said magnetic circuit;

a coil bobbin on which said drive coil is wound, said coil bobbin transmitting motion of said drive coil to said end caps of said outer case;

one or more dampers supporting said magnetic circuit on said end caps of said outer case; and a coupling member fitted in a center region of said electromechanical vibration converter and having end portions coupled to said end caps of said outer case;

wherein a drive force generated by said drive coil is transmitted only in the direction of said axis.

8. The body-sensible acoustic device of claim 7, said electromechanical vibration converter further comprising a slide guide member fitted in a guide hole for slidably guiding said coupling member, said guide hole being formed in a center pole of said magnetic circuit and extending in a direction of said axis.

9. The body-sensible acoustic device of claim 8, wherein said guide member is made of a self-lubricating material.

10. The body-sensible acoustic device of claim 8, wherein a gap between said coupling member and said slide guide member is in a range of 0.02 to 0.06 mm.

11. The body-sensible acoustic device of claim 7, wherein said coupling member has a shape which is a hollow cylindrical member.

12. The body-sensible acoustic device of claim 7, wherein said coupling member has a shape which is a solid cylindrical member.

13. The body-sensible acoustic device of claim 7, wherein said dampers provide stiffness and resistance between said outer case and said magnetic circuit.

14. The body-sensible acoustic device of claim 7, wherein said dampers are made of rubber.

15. The body-sensible acoustic device of claim 7, wherein said dampers each comprise a conical coil constructed by molding.

16. The body-sensible acoustic device of claim 7, wherein said coupling member extends entirely through said electromechanical vibration converter in a direction of said axis so that two sides of the converter are communicated.

* * * * *